US011133816B1

(12) United States Patent
Kim et al.

(10) Patent No.: US 11,133,816 B1
(45) Date of Patent: Sep. 28, 2021

(54) ANALOG-DIGITAL CONVERTER AND SEMICONDUCTOR MEMORY DEVICE HAVING THE SAME

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Kyoungho Kim, Hwaseong-si (KR); Dongryeol Oh, Daejeon (KR); Seungtak Ryu, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/011,115

(22) Filed: Sep. 3, 2020

(30) Foreign Application Priority Data

Mar. 25, 2020 (KR) .......................... 10-2020-0036062

(51) Int. Cl.
*H03M 1/12* (2006.01)
*H03M 1/20* (2006.01)
(Continued)

(52) U.S. Cl.
CPC .............. *H03M 1/206* (2013.01); *G11C 7/16* (2013.01); *G11C 11/4085* (2013.01); *H03M 1/1245* (2013.01)

(58) Field of Classification Search
CPC ........................... H03M 1/206; H03M 1/1245
(Continued)

(56) References Cited

U.S. PATENT DOCUMENTS 5,237,326 A 8/1993 Jeong
7,068,206 B2 6/2006 Augusto et al.
(Continued)

FOREIGN PATENT DOCUMENTS

KR 10-2007-0053481 A 5/2007
KR 10-1644999 B1 8/2016

*Primary Examiner* — Peguy Jean Pierre
(74) *Attorney, Agent, or Firm* — Sughrue Mion, PLLC

(57) ABSTRACT

An analog-digital converter includes a first analog-digital conversion unit configured to, during a first analog-digital conversion operation, sequentially charge each of n first differential node pairs, in response to a respective one of a differential sampling signal pair and first to $(n-1)^{th}$ differential signal pairs among n differential signal pairs, in response to each of the n first differential node pairs being sequentially charged, sequentially generate each of n first differential data pairs, and sequentially generate each of n upper differential data pairs to be used as n-bit upper digital data, in response to a respective one of the sequentially-generated n first differential data pairs. The first analog-digital conversion unit is further configured to, during a second analog-digital conversion operation, simultaneously discharge each of the n first differential node pairs, in response to a $n^{th}$ differential signal pair among the n differential signal pairs.

20 Claims, 9 Drawing Sheets

(51) Int. Cl.
*G11C 11/408* (2006.01)
*G11C 7/16* (2006.01)

(58) Field of Classification Search
USPC ............... 341/155, 134, 118, 139, 141, 143
See application file for complete search history.

(56) References Cited

U.S. PATENT DOCUMENTS

| | | |
|---|---|---|
| 7,119,727 B2 | 10/2006 | Itskovich |
| 8,269,660 B2 | 9/2012 | van Veldhoven |
| 8,854,243 B2 | 10/2014 | Yoshioka et al. |
| 8,890,741 B2 | 11/2014 | Dosho et al. |
| 9,007,074 B2 * | 4/2015 | Yang ............... G01R 17/02 324/680 |
| 9,323,226 B1 | 4/2016 | Waltari |
| 9,806,733 B1 | 10/2017 | Kinyua |
| 2007/0115162 A1 | 5/2007 | Kim |
| 2007/0194960 A1 * | 8/2007 | Wang ............... H03M 1/1004 341/120 |
| 2007/0262887 A1 * | 11/2007 | Matsuura ......... H03M 7/165 341/50 |

\* cited by examiner

| DP | DM | CP | CM |
|---|---|---|---|
| 0 | 0 | PREVIOUS STATE | |
| 0 | 1 | 0 | 1 |
| 1 | 0 | 1 | 0 |
| 1 | 1 | 1 | 1 |

ANALOG-DIGITAL CONVERTER AND SEMICONDUCTOR MEMORY DEVICE HAVING THE SAME

CROSS-REFERENCE TO THE RELATED APPLICATION

This application claims priority from Korean Patent Application No. 10-2020-0036062, filed on Mar. 25, 2020, in the Korean Intellectual Property Office, the disclosure of which is incorporated herein by reference in its entirety.

BACKGROUND

1. Field

The example embodiments of the disclosure relate to an analog-digital converter and a semiconductor memory device having the same.

2. Description of the Related Art

An analog-digital converter (ADC) receives an analog signal, and converts it into digital data. There are two types of ADCs: a successive approximation (SAR) ADC and a flash ADC.

The SAR ADC has an advantage of a simple configuration but a disadvantage of a slow operation speed compared to the flash ADC, and the flash ADC has an advantage of a fast operation speed but a disadvantage of a complicated configuration compared to the SAR ADC.

Therefore, various types of ADCs are being developed to improve the disadvantages of each of the SAR ADC and the flash ADC.

SUMMARY

According to example embodiments of the inventive concept, an analog-digital converter includes a first analog-digital conversion unit configured to, during a first analog-digital conversion operation, sequentially charge each of n first differential node pairs, in response to a respective one of a differential sampling signal pair and first to $(n-1)^{th}$ differential signal pairs among n differential signal pairs, in response to each of the n first differential node pairs being sequentially charged, sequentially generate each of n first differential data pairs, and sequentially generate each of n upper differential data pairs to be used as n-bit upper digital data, in response to a respective one of the sequentially-generated n first differential data pairs. The first analog-digital conversion unit is further configured to, during a second analog-digital conversion operation, simultaneously discharge each of the n first differential node pairs, in response to a $n^{th}$ differential signal pair among the n differential signal pairs, and in response to each of the n first differential node pairs being simultaneously discharged, generate n second differential data pairs having different phases or the same phase. The analog-digital converter further includes a second analog-digital conversion unit configured to perform a plurality of phase interpolation operations on at least two adjacent data of the n second differential data pairs to generate a $(2^n+m)$-bit thermometer code, m being smaller than $2^n$, and encode the $(2^n+m)$-bit thermometer code to generate at least $(n+1)$-bit lower digital data.

According to example embodiments of the inventive concept, an analog-digital converter includes a sampling and charging and discharging unit configured to, during a sampling operation, sample a differential input signal pair to generate a differential sampling signal pair, and generate the differential sampling signal pair to a first differential node pair, and during a first analog-digital conversion operation, charge and discharge the first differential node pair, in response to each of n upper differential data pairs that are used as n-bit upper digital data and that are sequentially generated, to sequentially generate n differential signal pairs changing from the differential sampling signal pair. The analog-digital converter further includes a first analog-digital conversion unit configured to, during the first analog-digital conversion operation, sequentially charge each of n second differential node pairs, in response to a respective one of the differential sampling signal pair and first to $(n-1)^{th}$ differential signal pairs among the n differential signal pairs, in response to each of the n second differential node pairs being sequentially charged, sequentially generate each of the n first differential data pairs, and sequentially generate each of the n upper differential data pairs, in response to a respective one of the sequentially-generated n first differential data pairs. The first analog-digital conversion unit is further configured to, during a second analog-digital conversion operation, simultaneously discharge each of the n second differential node pairs, in response to a $n^{th}$ differential signal pair among the n differential signal pairs, and in response to each of the n second differential node pairs being simultaneously discharged, generate n second differential data pairs having different phases or the same phase. The analog-digital converter further includes a second analog-digital conversion unit configured to perform a plurality of phase interpolation operations on at least two adjacent data of then second differential data pairs to generate a $(2^n+m)$-bit thermometer code, m being smaller than $2^n$, and encode the $(2^n+m)$-bit thermometer code to generate at least $(n+1)$-bit lower digital data.

According to example embodiments of the inventive concept, a semiconductor memory includes a predetermined number of analog-digital converters configured to receive a predetermined number of differential input signal pairs, respectively, from an external source, to generate 2n-bit digital data, respectively. Each of the analog-digital converters includes a sampling and charging and discharging unit configured to, during a sampling operation, sample a differential input signal pair to generate a differential sampling signal pair, and generate the differential sampling signal pair to a first differential node pair, and during a first analog-digital conversion operation, charge and discharge the first differential node pair, in response to each of n upper differential data pairs that are used as n-bit upper digital data and that are sequentially generated, to sequentially generate n differential signal pairs changing from the differential sampling signal pair. Each of the analog-digital converters further includes a first analog-digital conversion unit configured to, during the first analog-digital conversion operation, sequentially charge each of n second differential node pairs, in response to a respective one of the differential sampling signal pair and first to $(n-1)^{th}$ differential signal pairs among the n differential signal pairs, in response to each of the n second differential node pairs being sequentially charged, sequentially generate each of the n first differential data pairs, and sequentially generate each of the n upper differential data pairs, in response to a respective one of the sequentially-generated n first differential data pairs. The first analog-digital conversion unit is further configured to, during a second analog-digital conversion operation, simultaneously discharge each of the n second differential node pairs, in response to a $n^{th}$ differential signal pair among the n differential signal pairs, and in response to each of the n second differential node pairs being simultaneously discharged, generate n second differential data pairs having different phases or the same phase. Each of the analog-digital converters further includes a second analog-digital conversion unit configured to perform a plurality of phase interpolation operations on at least two adjacent data of the n second differential data pairs to generate a $(2^n+m)$-bit thermometer code, m being smaller than $2^n$, and encode the $(2^n+m)$-bit thermometer code to generate at least (n+1)-bit lower digital data. Each of the analog-digital converters is configured to generate the 2n-bit digital data, using the n-bit upper digital data and the at least (n+1)-bit lower digital data.

DETAILED DESCRIPTION OF EXAMPLE EMBODIMENTS

The example embodiments of the disclosure provide an analog-digital converter (ADC) having a simple configuration and a fast operation speed, and a semiconductor memory device having the same.

Hereinafter, the ADC and the semiconductor memory device having the same according to example embodiments of the inventive concept will be described with reference to the accompanying drawings.

Figure 1:
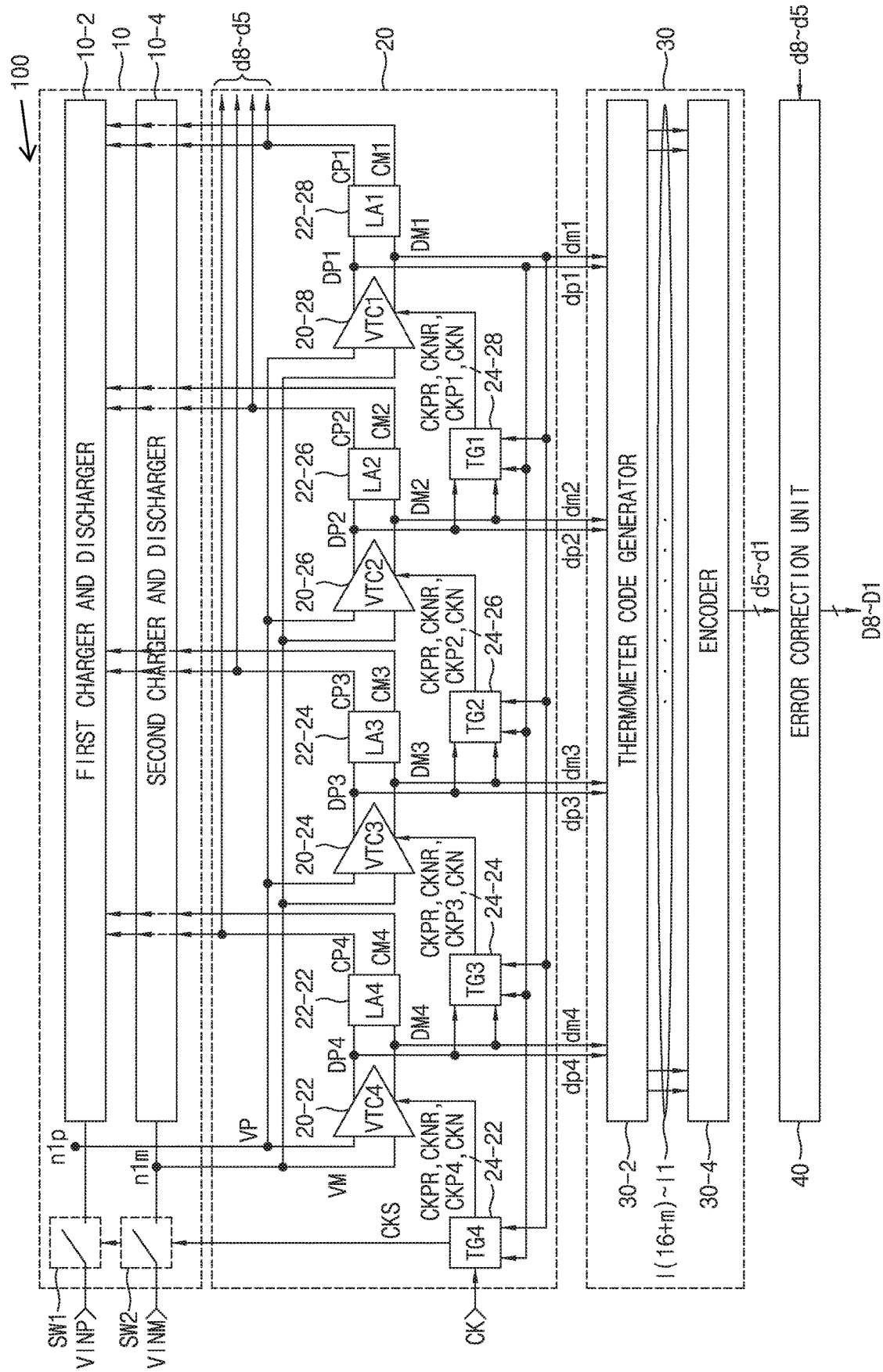
FIG. 1 is a block diagram illustrating a configuration of an analog-digital converter according to an example embodiment of the inventive concept.

FIG. 1 is a block diagram illustrating a configuration of an analog-digital converter according to an example embodiment of the inventive concept.

The analog-digital converter 100 may include a sampling & charging and discharging unit 10, a first analog-digital conversion unit 20, a second analog-digital conversion unit 30, and an error correction unit 40. The sampling & charging and discharging unit 10 may include first and second switches SW1 and SW2, a first charger and discharger 10-2, and a second charger and discharger 10-4. The first analog-digital conversion unit 20 may include first to fourth voltage-time converters (VTC4 to VTC1) 20-22 to 20-28, first to fourth latches (LA4 to LA1) 22-22 to 22-28, and a timing generation unit 24. The timing generation unit 24 may include first to fourth timing generators (TG4 to TG1) 24-22 to 24-28. The second analog-digital conversion unit 30 may include a thermometer code generator 30-2 and an encoder 30-4.

Function of each of the blocks shown in FIG. 1 will be described below.

The sampling & charging and discharging unit 10 may sample a differential input signal pair VINP, VINM to generate a differential sampling signal pair VP, VM to a first differential node pair n1p, n1m during a sampling operation, and perform a charging operation and a discharging operation on the first differential node pair n1p, n1m in response to each pair of four upper differential data pair (CP4, CM4) to (CP1, CM1) that are sequentially generated and sequentially generate four differential signal pairs that are changing from the differential sampling signal pair VP, VM through the first differential node pair n1p, n1m during a first analog-digital conversion operation.

The first and second switches SW1 and SW2 may be turned on in response to a sampling clock signal CKS during the sampling operation, and transmit the differential input signal pair VINP, VINM to the first differential node pair n1p, n1m to generate the differential sampling signal pair VP, VM.

The first charger and discharger 10-2 may be connected to one node n1p of the first differential node pair n1p, n1m, and perform the charging operation or the discharging operation of increasing or decreasing a level of one node n1p of the first differential node pair n1p, n1m by a level corresponding to a binary weight of each pair in response to each pair of the four upper differential data pairs (CP4, CM4) to (CP1, CM1).

The second charger and discharger 10-4 may be connected to another node n1m of the first differential node pair n1p, n1m, and perform the discharging operation or the charging operation of decreasing or increasing a level of another node n1m of the first differential node pair n1p, n1m by the level corresponding to the binary weight of each pair in response to each pair of the four upper differential data pairs (CP4, CM4) to (CP1, CM1).

Here, a ratio of the binary weight of the four upper differential data pairs (CP4, CM4) to (CP1, CM1) may be 8:4:2:1.

When the first charger and discharger 10-2 performs the charging operation, the second charger and discharger 10-4 may perform the discharging operation, and when the first charger and discharger 10-2 performs the discharging operation, the second charger and discharger 10-4 may perform the charging operation.

During the first analog-digital conversion operation, the first analog-digital conversion unit 20 may sequentially perform the charging operation on each pair of four second differential nodes in response to each pair of the differential sampling signal pair and first to third differential signal pairs among the four differential signal pairs that are sequentially generated through the first differential node pair n1p, n1m to sequentially generate each pair of four first differential data pairs (DP4, DM4) to (DP1, DM1), and sequentially generate each pair of the four upper differential data pairs (CP4, CM4) to (CP1, CM1) in response to each pair of the four first differential data pairs (DP4, DM4) to (DP1, DM1). During a second analog-digital conversion operation, the first analog-digital conversion unit 20 may perform the discharging operation on each of the four second differential node pairs in response to a fourth differential signal pair of the four differential signal pairs to generate four second differential data pairs (dp4, dm4) to (dp1, dm1) having different phases (delay times) or the same phase (delay time).

Before the sampling operation, each of the first to fourth voltage-time converters 20-22 to 20-28 may reset n second differential node pairs in response to a pull-down reset clock signal CKNR. During the first analog-digital conversion operation after the sampling operation, each of the first to fourth voltage-time converters 20-22 to 20-28 may sequentially perform the charging operation on each pair of the four second differential node pairs in response to each of n pull-up clock signals CKP4 to CKP1 that are sequentially generated and each pair of the differential sampling signal pair and the first to third differential signal pairs among the four differential signal pairs that are sequentially generated to sequentially generate each pair of the four first differential data pairs (DP4, DM4) to (DP1, DM1). After the first analog-digital conversion operation, each of the first to fourth voltage-time converters 20-22 to 20-28 may reset the four second differential node pairs to a power supply voltage in response to a pull-up reset clock signal CKPR, and during the second analog-digital conversion operation, each of the first to fourth voltage-time converters 20-22 to 20-28 may simultaneously perform the discharging operation on each pair of the four second differential node pairs in response to the pull-down clock signal CKN and the fourth differential signal pair among the four differential signal pairs to generate the four second differential data pairs (dp4, dm4) to (dp1, dm1).

Each of the first and fourth latches 22-22 to 22-28 may sequentially latch each pair of the four first differential data pairs (DP4, DM4) to (DP1, DM1) to sequentially generate the four upper differential data pairs (CP4, CM4) to (CP1, CM1). Data CP4, CP3, CP2, and CP1 of the four upper differential data pairs (CP4, CM4) to (CP1, CM1) may be generated as 4-bit upper digital data d8 to d5.

During the sampling operation, the timing generation unit 24 may generate a sampling clock signal CKS. During the first analog-digital conversion operation, the timing generation unit 24 may generate a first pull-up clock signal CKP4 among the four pull-up clock signals CKP4 to CKP1 (for example, generate the first pull-up clock signal CKP4 by detecting a transition of the sampling clock signal CKS), sequentially generate the second pull-up signal CKP3 to the fourth pull-up clock signal CKP1 by detecting a transition of each pair of the first to third differential data pairs among the four first differential data pairs (DP4, DM4) to (DP1, DM1), and generate the pull-up reset clock signal CKPR in response to the fourth pull-up clock signal CKP1. During the second analog-digital conversion operation, the timing generation unit 24 may simultaneously generate the pull-down clock signals CKN4 to CKN1 in response to the pull-up reset clock signal CKPR. Further, after the second analog-digital conversion operation (before the sampling operation), the timing generation unit 24 may generate the pull-down reset clock signal CKNR in response to the pull-down clock signals CKN4 to CKN1.

The second analog-digital conversion unit 30 may perform a plurality of phase interpolation operations on at least two adjacent data of the four differential data pairs (dp4, dm4) to (dp1, dm1) to generate $2^4(=16)$+m-bit thermometer code I(16+m) to I1, and encode the (16+m)-bit thermometer code to generate at least 5-bit lower digital data d5 to d1 (when the upper digital data is 4-bit data, the lower digital data may be 5-bit data).

The thermometer code generator 30-2 may perform the plurality of phase interpolation operations on at least two adjacent data of the four second differential data pairs (dp4, dm4) to (dp1, dm1) to generate the (16+m)-bit thermometer code (for example, I(16+m) to I1).

The encoder 30-4 may encode the (16+m)-bit thermometer code to generate the at least 5-bit lower digital data d5 to d1.

The error correction unit 40 may perform a calculation on the 4-bit upper digital data d8 to d5 and the at least 5-bit lower digital data d5 to d1, that is, perform an error correction operation, and generate 8-bit digital data D8 to D1.

Figure 2:
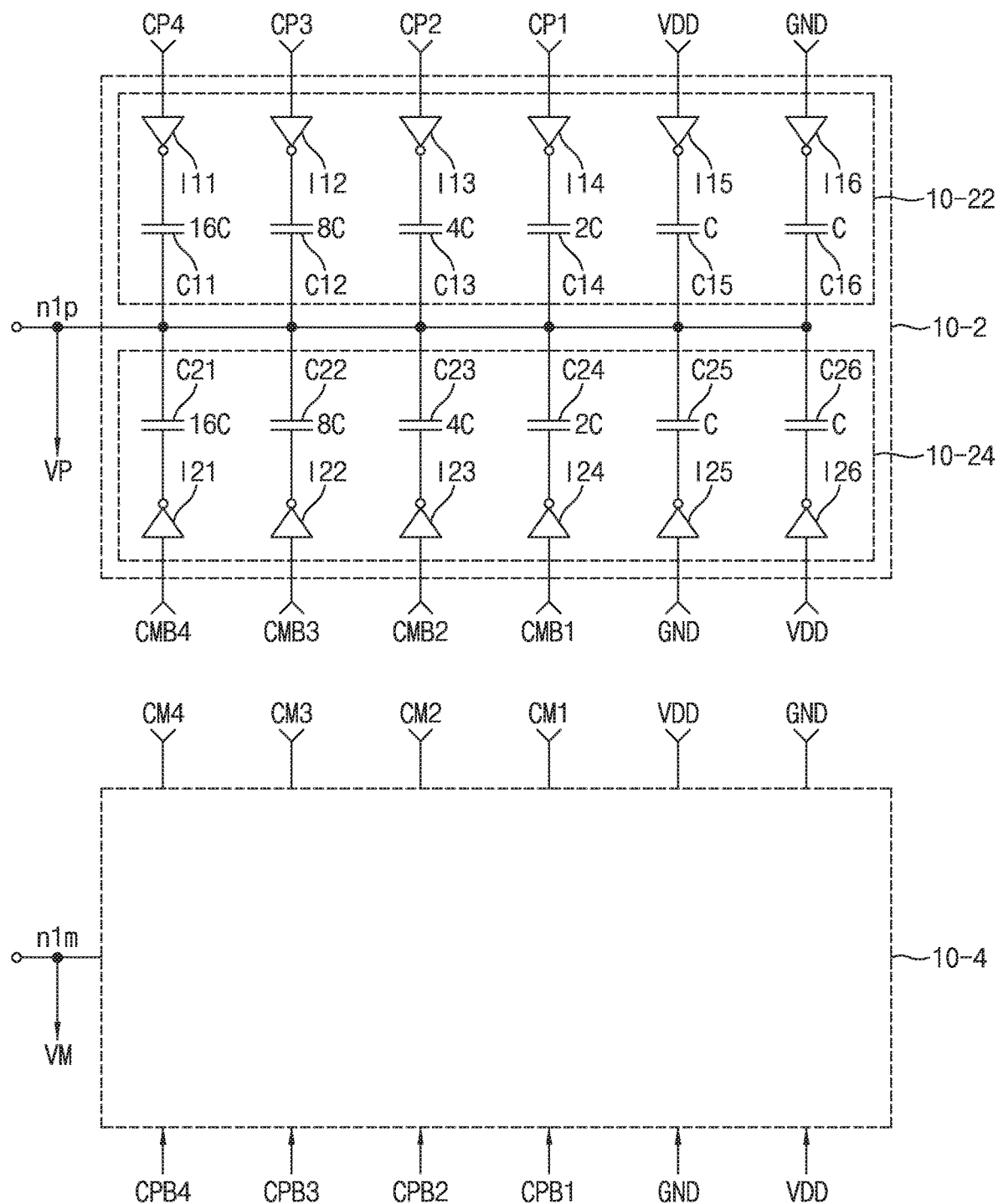
FIG. 2 is a circuit diagram illustrating a configuration of a first charger and discharger and a second charger and discharger according to an example embodiment of the inventive concept.

FIG. 2 is a circuit diagram illustrating a configuration of the first charger and discharger and the second charger and discharger according to an example embodiment of the inventive concept.

The first charger and discharger 10-2 may include a first discharger 10-22 including first to sixth inverters I11 to I16 and first to sixth capacitors C11 to C16, and a first charger 10-24 may include seventh to twelfth inverters I21 to I26 and seventh to twelfth capacitors C21 to C26. Capacitances of the first to sixth capacitors C11 to C16 may be 16C, 8C, 4C, 2C, C, C, respectively, and capacitances of the seventh to twelfth capacitors C21 to C26 may be 16C, 8C, 4C, 2C, C, C, respectively.

The first inverter I11 and the first capacitor C11, the second inverter I12 and the second capacitor C12, the third inverter I13 and the third capacitor C13, the fourth inverter I14 and the fourth capacitor C14, the fifth inverter I15 and the fifth capacitor C15, the sixth inverter I16 and the sixth capacitor C16 may be connected in series between the node n1p and each of the data CP4 to CP1 of the four upper differential data pairs (CP4, CM4) to (CP1, CM1), a power supply voltage VDD, and a ground voltage GND. The seventh inverter I21 and the seventh capacitor C21, the eighth inverter I22 and the eighth capacitor C22, the ninth inverter I23 and the ninth capacitor C23, the tenth inverter I24 and the tenth capacitor C24, the eleventh inverter I25 and the eleventh capacitor C25, the twelfth inverter I26 and the twelfth capacitor C26 may be connected in series between the node n1p and each of the data CM4 to CM1 of the four upper differential data pairs (CP4, CM4) to (CP1, CM1), the ground voltage GND, and the power supply voltage VDD.

The second charger and discharger 10-4 may have the same configuration as the first charger and discharger 10-2, except that the second charger and discharger 10-4 is connected to the node n1m instead of the node n1p, and the data CM4 to CM1 is received instead of the data CP4 to CP1 and the data CPB4 to CPB1 is received instead to the data CMB4 to CMB1.

In FIG. 2, the data CMB4 to CMB1 may be inverted data of the data CM4 to CM1, and the data CPB4 to CPB1 may be inverted data of the data CP4 to CP1.

Each of the first charger and discharger 10-2 and the second charger and discharger 10-4 shown in FIG. 2 may be a capacitive digital-analog converter.

An operation of the first charger and discharger 10-2 and the second charger and discharger 10-4 shown in FIG. 2 will be described below.

Referring to FIG. 2, during the sampling operation, the first charger and discharger 10-2 may receive the differential input signal pair to generate the differential sampling signal pair VP, VM through the first differential node pair n1p, n1m.

During the first analog-digital conversion operation, the first charger and discharger 10-2 and the second charger and discharger 10-4 may perform a charging operation and a discharging operation of increasing and decreasing levels of the sampling differential signal pair by levels corresponding to a binary weight of each pair of the first differential data pairs (CP4, CM4) to (CP1, CM1). For example, when the first charger and discharger 10-2 performs the charging operation of increasing the levels of the differential sampling signal pair by the levels corresponding to the binary weight of the first differential data pair CP4, CM4, that is, (16/64) VDD, the second charger and discharger 10-4 may perform the discharging operation of decreasing the levels of the differential sampling signal pair by the levels corresponding to the binary weight of the first differential data pair CP4, CM4, that is, (16/64)VDD. On the other hand, when the first charger and discharger 10-2 performs the discharging operation, the second charger and discharger 10-4 may perform the charging operation. Further, when the first charger and discharger 10-2 performs the charging operation of increasing the levels of the first differential node pair n1p, n1m by levels corresponding to a binary weight of the first differential data pair CP3, CM3, that is, (8/64)VDD, the second charger and discharger 10-4 may perform the discharging operation of decreasing the levels of the first differential node pair n1p, n1m by the levels corresponding to the binary weight of the first differential data pair CP3, CM3, that is, (8/64)VDD. On the other hand, when the first charger and discharger 10-2 performs the discharging operation, and the second charger and discharger 10-4 may perform the charging operation.

Figure 3:
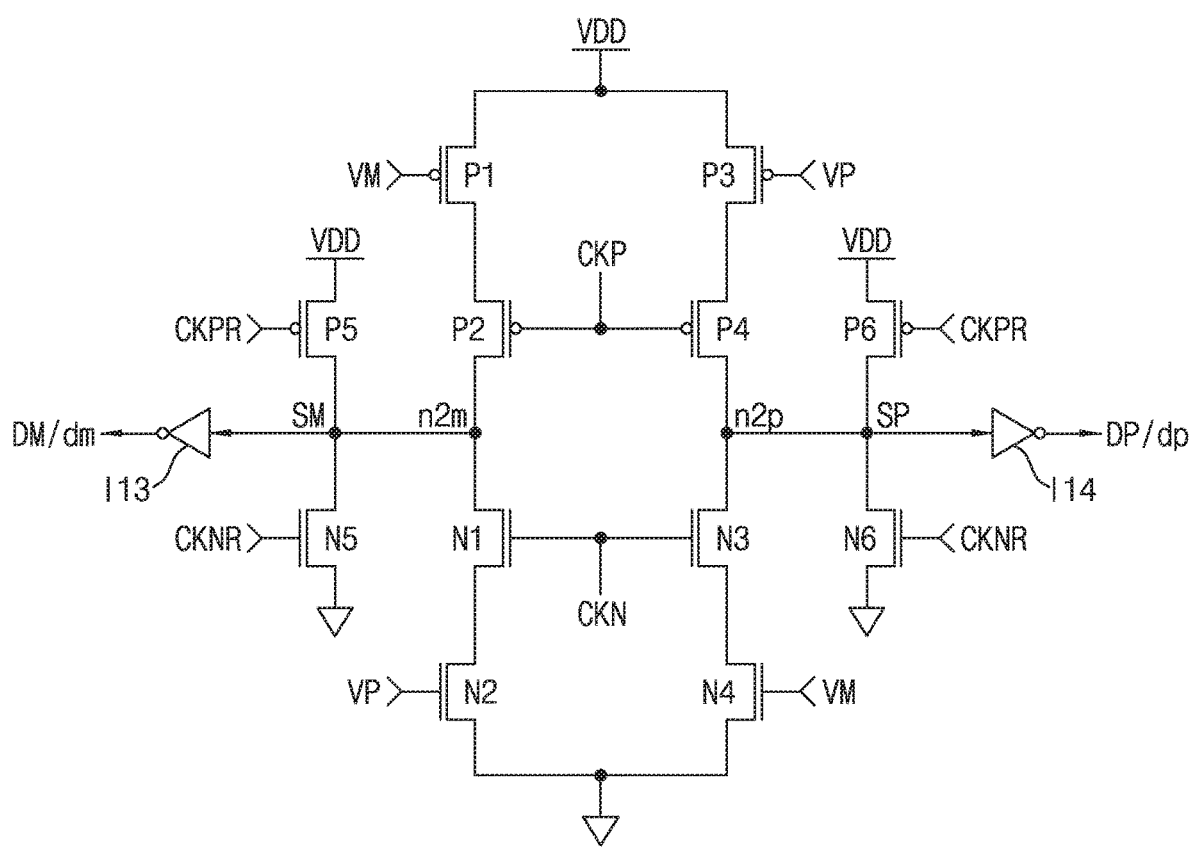
FIG. 3 is a circuit diagram illustrating a configuration of a voltage-time converter according to an example embodiment of the inventive concept.

FIG. 3 is a circuit diagram illustrating a configuration of the voltage-time converter according to an example embodiment of the inventive concept.

The voltage-time converter shown in FIG. 3 illustrates a configuration of each of the first to fourth voltage-time converters 20-22 to 20-28 shown in FIG. 1, and n2p and n2m may correspond to each of the second differential node pairs (n2p4, n2m4) to (n2p1, n2m1), DP and DM may correspond to one pair among the first differential data pairs (DP4, DM4) to (DP1, DM1) of the first to fourth voltage-time converters 20-22 to 20-28 or one pair among the second differential data pairs (dp4, dm4) to (dp1, dm1), and CKP may correspond to one among the pull-up clock signals CKP4 to CKP1.

The voltage-time converter may include first to fourth pull-up transistors P1 to P4, first and second pull-up reset transistors P5 and P6, first to fourth pull-down transistors N1 to N4, first and second pull-down reset transistors N5 and N6, and thirteenth and fourteenth inverters I13 and I14. Each of the first to fourth pull-up transistors P1 to P4 and the first and second pull-up reset transistors P5 and P6 may be a PMOS transistor, and each of the first to fourth pull-down transistors N1 to N4 and the first and second pull-down reset transistors N5 and N6 may be an NMOS transistor.

The first pull-up transistor P1 and the second pull-up transistor P2 may be connected in series between the power supply voltage VDD and one node n2m of the second differential node pair n2p, n2m, and perform a charging operation on the one node n2m of the second differential node pair n2p, n2m in response to one VM of the differential sampling signal pair VP, VM and the pull-up clock signal CKP.

The third pull-up transistor P3 and the fourth pull-up transistor P4 may be connected in series between the power supply voltage VDD and another node n2p of the second differential node pair n2p, n2m, and perform a charging operation on the another node n2p of the second differential node pair n2p, n2m in response to another one VP of the differential sampling signal pair VP, VM and the pull-up clock signal CKP.

The first pull-up reset transistor P5 and the second pull-up rest transistor P6 may be connected between the power supply voltage VDD and each of the one node n2m and the another node n2p of the second differential node pair n2p, n2m, and reset the second differential node pair n2p, n2m to the power supply voltage VDD in response to the pull-up reset clock signal CKPR.

The first pull-down transistor N1 and the second pull-down transistor N2 may be connected in series between the one n2m of the second differential node pair n2p, n2m and the ground voltage, and perform the discharging operation on the one n2m of the second differential node pair n2p, n2m in response to the pull-down clock signal CKN and the another one VP of the differential sampling signal pair VP, VM.

The third pull-down transistor N3 and the fourth pull-down transistor N4 may be connected between the another one n2p of the second differential node pair n2p, n2m and the ground voltage, and perform the discharging operation on the another one n2p of the second differential node pair n2p, n2m in response to the pull-down clock signal CKN and the one VM of the differential sampling signal pair VP, VM.

The first pull-down reset transistor N5 and the second pull-down reset transistor N6 may be connected between each of the one n2m and the another one n2p of the second differential node pair n2p, n2m and the ground voltage, and reset the second differential node pair n2p, n2m to the ground voltage in response to the pull-down reset clock signal CKNR.

The thirteenth inverter I13 may invert a level of a signal SM of the node n2m to generate data DM or dm of the first differential data pair DM, DP or the second differential data pair dm, dp, and the fourteenth inverter I14 may invert a level of a signal SP of the node n2p to generate data DP or dp of the first differential data pair DM, DP or the second differential data pair dm, dp.

An operation of the first voltage-time converter 20-22 shown in FIG. 3 will be described below.

Before the sampling operation, the first and second pull-down reset transistors N5 and N6 may be turned on in response to the pull-down reset clock signal CKNR to reset the second differential node pair n2n, n2p to the ground voltage.

During the first analog-digital conversion operation, the second and fourth pull-up transistors P2 and P4 may be turned on in response to the pull-up clock signal CKP, and when the sampling signal VP has a smaller level than the sampling signal VM, the first and third pull-up transistors P1 and P3 may operate to charge the node n2p faster than the node n2m. Accordingly, the signal SP may reach to a threshold voltage of the fourteenth inverter I14 faster than the signal SM, the thirteenth inverter I13 may generate the data DM having the power supply voltage, and the fourteenth inverter I14 may generate the data DP having the ground voltage. After this, the node n2m may be charged, the signal SM may also reach to the threshold voltage of the thirteenth inverter I13, and then the thirteenth inverter I13 may generate the data DM having the ground voltage. On the other hand, when the sampling signal VM has a smaller level than the sampling signal VP, the first and third pull-up transistors P1 and P3 may operate to charge the node n2m faster than the node n2p. Accordingly, the signal SM may reach to a threshold voltage of the thirteenth inverter I13 faster than the signal SP, the thirteenth inverter I13 may generate the data DM having the ground voltage, and the fourteenth inverter I14 may generate the data DP having the power supply voltage. After this, the node n2p may be charged, the signal SP may also reach to the threshold voltage of the fourteenth inverter I14, and then the fourteenth inverter I14 may generate the data DP having the ground voltage.

Further, after the first analog-digital conversion operation, the first and second pull-up reset transistors P5 and P6 may be turned on in response to the pull-up reset clock signal CKPR to reset the second differential node pair n2m, n2p to the power supply voltage.

During the second analog-digital conversion, the first and third pull-down transistors N1 and N3 may be turned on in response to the pull-down clock signal CKN, and when the sampling signal VP is greater than the sampling signal VM, the second and fourth pull-down transistors N2 and N4 may operate to discharge the node n2m faster than the node n2p. Accordingly, the signal SM may reach to the threshold voltage of the thirteenth inverter I13 faster than the signal SP, the thirteenth inverter I13 may generate the data dm having the power supply voltage, and then the fourteenth inverter I14 may generate the data dp having the power supply voltage. On the other hand, when the sampling signal VP is smaller than the sampling signal VM, the second and fourth pull-down transistors N2 and N4 may operate to discharge the node n2p faster than the node n2m. Accordingly, the signal SP may reach to the threshold voltage of the fourteenth inverter I14 faster than the signal SM, the fourteenth inverter I14 may generate the data dp having the power supply voltage, and then the thirteenth inverter I13 may generate the data dm having the power supply voltage.

The first voltage-time converter 20-22 shown in FIG. 3 may perform the charging operation by the first to fourth pull-up transistors P1 to P4 after being reset to the ground voltage to perform the first analog-digital conversion operation, and perform the discharging operation by the first to fourth pull-down transistors N1 to N4 after being reset to the power supply voltage to perform the second analog-digital conversion operation.

Each of the second to third voltage-time converters 20-24 to 20-28 may have the same configuration and perform the same operation as the first voltage-time converter 20-22.

Referring to FIGS. 1 to 3, a ratio of a size of the second pull-down transistor N2 and a size of the fourth pull-down transistor N4 of each of the first to fourth voltage-time converters 20-22 to 20-28 may be different from each other. For example, a ratio of the size of the second pull-down transistor N2 and the size of the fourth pull-down transistor N4, of the first voltage-time converter 20-22, may be i:j, a ratio of the size of the second pull-down transistor N2 and the size of the fourth pull-down transistor N4, of the second voltage-time converter 20-24, may be x:y, a ratio of the size of the second pull-down transistor N2 and the size of the fourth pull-down transistor N4, of the third voltage-time converter 20-26, may be y:x, and a ratio of the size of the second pull-down transistor N2 and the size of the fourth pull-down transistor N4, of the fourth voltage-time converter 20-28, may be j:i. Here, a difference between i and j may be greater than that between x and y, i+j may be equal to x+y. For example, i is 3, j is 7, x is 4, and y is 6. Accordingly, the second pull-down transistors N2 and the fourth pull-down transistors N4 of the first to fourth voltage-time converters 20-22 to 20-28 may have different reference voltages.

Figures 4A, 4B:
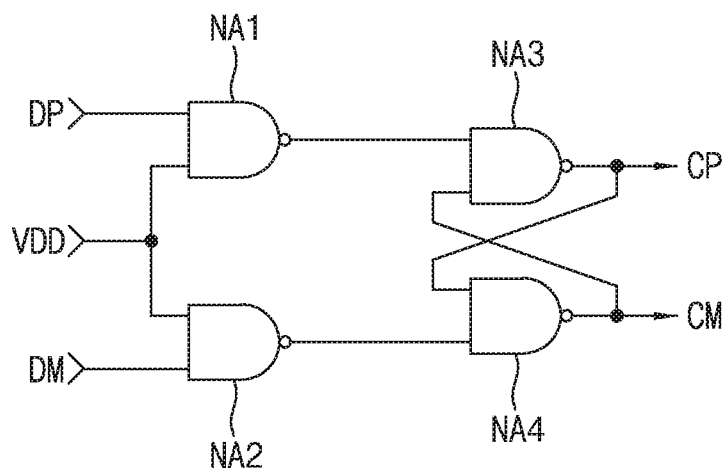
FIGS. 4A and 4B are diagrams illustrating a configuration of a latch and a truth table according to an example embodiment of the inventive concept.

FIGS. 4A and 4B are diagrams illustrating a configuration of the latch and a truth table according to an example embodiment of the inventive concept.

The latch shown in FIG. 4A illustrates a configuration of each of the four latches LA4 to LA1 shown in FIG. 1, DP, DM may be one pair among the first differential data pairs (DP4, DM4) to (DP1, DM1) output from the first to fourth voltage-time converters 20-22 to 20-28, and CP, CM may be one pair among the four upper differential data pairs (CP4, CM4) to (CP1, CM1). The latch shown in FIG. 4A may include four NAND gates NA1 to NA4.

Referring to FIGS. 4A and 4B, the latch may latch the first differential data pair DP, DM to generate the upper differential data pair CP, CM. When the first differential data pair DP, DM is "0", "0", the latch may maintain a previous state of the upper differential data pair CP, CM. When the first differential data pair DP, DM is "0", "1", the latch may generate the upper differential data pair CP, CM of "0" and "1", and when the first differential data pair DP, DM is "1", "0", the latch may generate the upper differential data pair CP, CM of "1", "0". Further, when the first differential data pair DP, DM is "1", "1", the latch may generate the upper differential data pair CP, CM of "1", "1".

Figure 5:
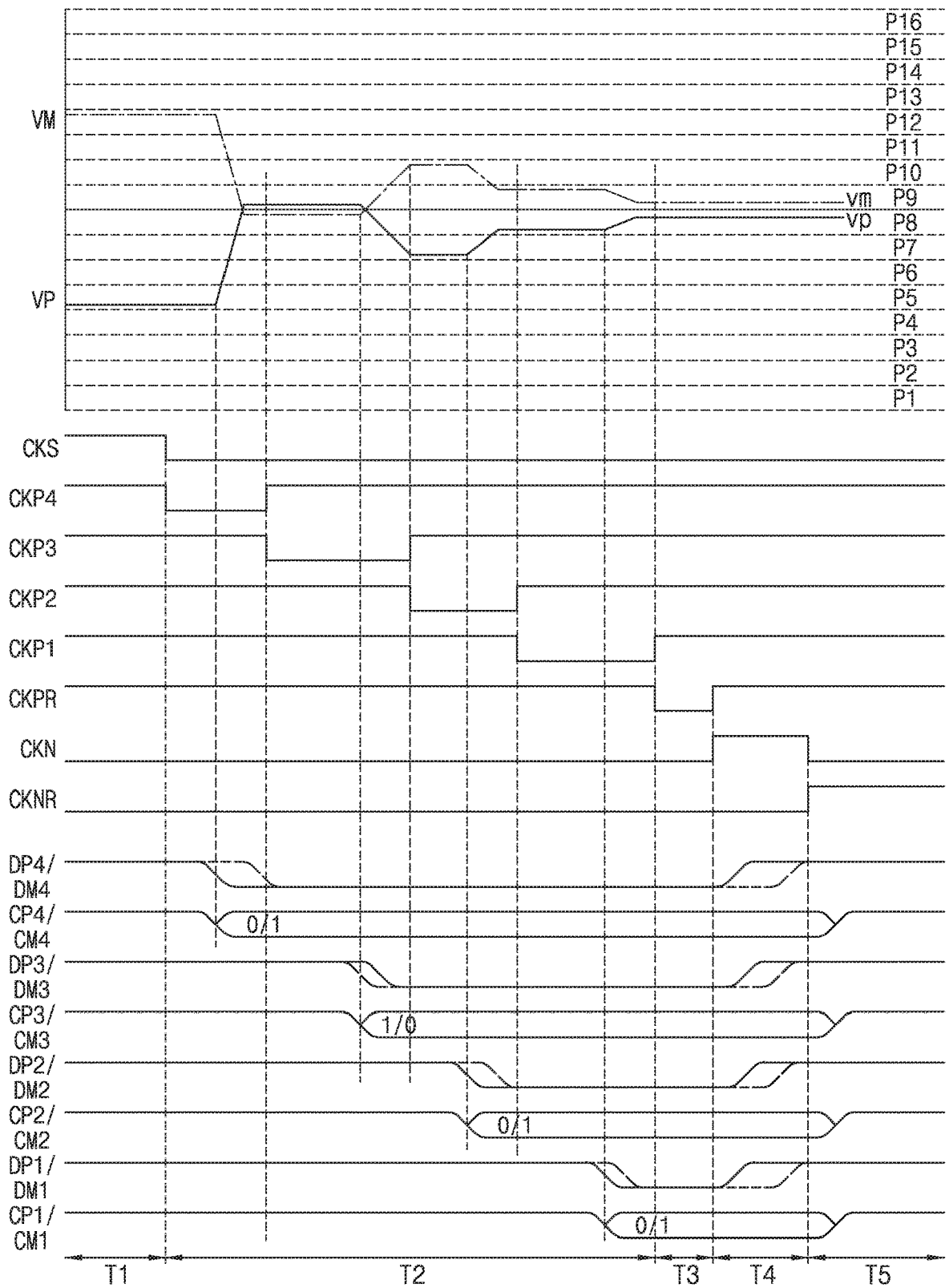
FIG. 5 is an operation timing diagram for describing an operation of an analog-digital converter according to an example embodiment of the inventive concept.

FIG. 5 is an operation timing diagram for describing an operation of the analog-digital converter according to an example embodiment of the inventive concept.

FIG. 5 enlarges changes of levels of the differential signal pair VP, VM of the first differential node pair n1p, n1m in comparison with changes of levels of other signals CKS, CKP4 to CKP1, CKPR, CKN, CKNR, DP/DM, CP/CM. Further, FIG. 5 illustrates an operation of generating the upper digital data CP4 to CP1 of "0100" by converting the sampling signal VP of one voltage section among 16 first to sixteenth voltage sections P1 to P16 between the ground voltage 0V and the power supply voltage VDD, for example, the fifth voltage section P5 between (1/4)VDD and (5/16)VDD. Referring to FIG. 5, the first voltage section P1 between 0V and (1/16)VDD may be a section corresponding to the upper digital data "0000", the fifth voltage section P5 between (1/4)VDD and (5/16)VDD may be a section corresponding to the upper digital data "0100", and the sixteenth voltage section between (15/16)VDD and VDD may be a section corresponding to the upper digital data "1111". That is, the first to sixteenth voltage sections may be sections corresponding to upper digital data different from each other.

Referring to FIGS. 1 to 5, before a sampling operation period T1, the first to fourth timing generators 24-22 to 24-28 may generate a pull-down reset clock signal CKNR of a "high" level. The first and second pull-down reset transistors N5 and N6 of the first to fourth voltage-time converters 20-22 to 20-28 may be turned on to reset all of the second differential node pairs (n2m4, n2p4) to (n2m1, n2p1) to the ground voltage to generate the first differential data pairs (DP4, DM4) to (DP1, DM1) of "high" levels (data "1").

During the sampling operation period T1, the first timing generator 24-22 may generate the sampling clock signal CKS. The first switch SW1 and the second switch SW2 may be turned on in response to the sampling clock signal CKS, and transmit the differential input signal pair VINP, VINM to the first differential node pair n1p, n1m.

During the first analog-digital conversion operation period T2, the first timing generator 24-22 may generate the pull-up clock signal CKP4 of a "low" level. The second and fourth pull-up transistors P2 and P4 of the first voltage-time converter 20-22 may be turned on in response to the pull-up clock signal CKP4 of the "low" level. Further, because the level of the sampling signal VP is smaller than that of the sampling signal VM, the third and fourth pull-up transistors P3 and P4 may be charged faster than the first and second pull-up transistors P1 and P2. The thirteenth inverter I13 and fourteenth inverter I14 may invert the levels of the signals of the second differential node pair n2m4, n2p4 to generate the first differential data pair DP4, DM4 of "0", "1". The first latch 22-22 may latch the first differential data pair DP4, DM4 of "0", "1" to generate the upper differential data pair CP4, CM4 of "0" and "1". Accordingly, the first charger and discharger 10-2 may perform the charging operation to increase the sampling signal VP by (1/4)VDD, and the second charger and discharger 10-4 may perform the discharging operation to decrease the sampling signal VM by (1/4)VDD.

The second timing generator 24-24 may generate the pull-up clock signal CKP3 of a "low" level when detecting a transition of the first differential data pair DP4, DM4 (for example, when detecting a transition of one of the first differential data pair DP4, DM4 transits from a "high" level to a "low" level). The second and fourth pull-up transistors P2 and P4 of the second voltage-time converter 20-24 may be turned on in response to the pull-up clock signal CKP3 of the "low" level. Further, because the level of the sampling signal VM is smaller than the level of the sampling signal VP, the first and second pull-up transistors P1 and P2 may charge the node n2m3 faster than the third and fourth pull-up transistors P3 and P4. The thirteenth inverter I13 and the fourteenth inverter I14 may invert levels of the signals SM4, SP4 of the second differential node pair n2m3, n2p3 to generate the first differential data pair DP3, DM3 of "1", "0". The second latch 22-24 may latch the first differential data pair DP3, DM3 of "1", "0" to generate the upper differential data pair CP3, CM3 of "1", "0". Accordingly, the first charger and discharger 10-2 may perform the discharging operation to decrease the sampling signal VP by (1/8)VDD, and the second charger, and discharger 10-4 may perform the charging operation to increase the sampling signal VM by (1/8)VDD.

The third timing generator 24-26 may generate the pull-up clock signal CKP2 of a "low" level when detecting a transition of the first differential data pair DP3, DM3. The third voltage-time converter 20-26 may perform the same operation as the first voltage-time converter 20-22 described above to generate the first differential data pair DP2, DM2 of "0", "1". The third latch 22-26 may perform the same operation as the first latch 22-22 described above to generate the upper differential data pair CP2, CM2 of "0", "1". Accordingly, the first charger and discharger 10-2 may perform the charging operation to increase the sampling signal VP by (1/16)VDD, and the second charger and discharger 10-4 may perform the discharging operation to decrease the sampling signal VM by (1/16)VDD.

The fourth timing generator 24-28 may generate the pull-up clock signal of a "low" level when detecting a transition of the first differential data pair DP2, DM2. The fourth voltage-time converter 20-28 may perform the same operation as the first voltage-time converter 20-22 described above to generate the first differential data pair DP1, DM1 of "0", "1". The fourth latch 22-28 may perform the same operation as the first latch 22-22 described above to generate the upper differential data pair CP1, CM1 of "0", "1". Accordingly, the first charger and discharger 10-2 may perform the charging operation to increase the signal VP by (1/32)VDD, and the second charger and discharger 10-4 may perform the discharging operation to decrease the signal VM by (1/32)VDD.

During a pull-up reset period T3 after the first analog-digital conversion operation period T2, the first to fourth timing generators 24-22 to 24-28 may generate the pull-up reset clock signal CKPR of a "low" level when detecting a transition of the first differential data pair DP1, DM1. Accordingly, the fifth and sixth pull-up reset transistors P5 and P6 of each of the first to fourth voltage-time converters 20-22 to 20-28 may be turned on, and reset the four second differential node pairs (n2p4, n2m4) to (n2p1, n2m1) to the power supply voltage. Accordingly, because the reset operation is performed during the pull-up reset period T3 at a state in which the second differential node pairs (n2p4, n2m4) to (n2p1, n2m1) have been already reset to the power supply voltage, power consumed for the reset operation may be reduced.

During the second analog-digital conversion operation period T4, the first to fourth timing generators 24-22 to 24-28 may generate the pull-down clock signal CKN of a "high" level. The first and third pull-down transistors N1 and N3 of the first to fourth voltage-time converters 20-22 to 20-28 may be turned on, and the second and fourth pull-down transistors N2 and N4 may perform the discharging operation using a remaining differential level pair vp, vm of the differential sampling signal pair VP, VM. In each of the first to fourth voltage-time converters 20-22 to 20-28, because the level vm of the sampling signal VM is greater than the level vp of the sampling signal VP, the level of the node n2p may be discharged through the third and fourth pull-down transistors N3 and N4 faster than the level of the node n2m is discharged through the first and second pull-down transistors N1 and N2, and the fourteen inverter I14 may generate a signal of a "high" level faster than the thirteenth inverter I13. Because the size of the second pull-down transistor N2 and the size of the fourth pull-down transistor N4 of each of the first to fourth voltage-time converters 20-22 to 20-28 are different from each other, the four second differential data pairs (dp4, dm4) to (dp1, dm1) having different phases (delay times) or the same phase (delay time) may be simultaneously generated using the remaining differential level pair vp, vm of the differential sampling signal pair VP, VM.

During a pull-down reset period T5 after the second analog-digital conversion operation period T4, the first to fourth timing generators 24-22 to 24-28 may generate the pull-down reset clock signal CKPR of a "high" level. Accordingly, the fifth and sixth pull-down reset transistors N5 and N6 of the first to fourth voltage-time converters 20-22 to 20-28 may be turned on to reset the four second differential node pairs (n2p4, n2m4) to (n2p1, n2m1) to the ground voltage. Because the reset operation is performed during the pull-down reset period T5 at a state in which the second differential node pairs (n2p4, n2m4) to (n2p1, n2m1) have been already reset to the ground voltage, power consumed for the reset operation may be reduced.

Figure 6:
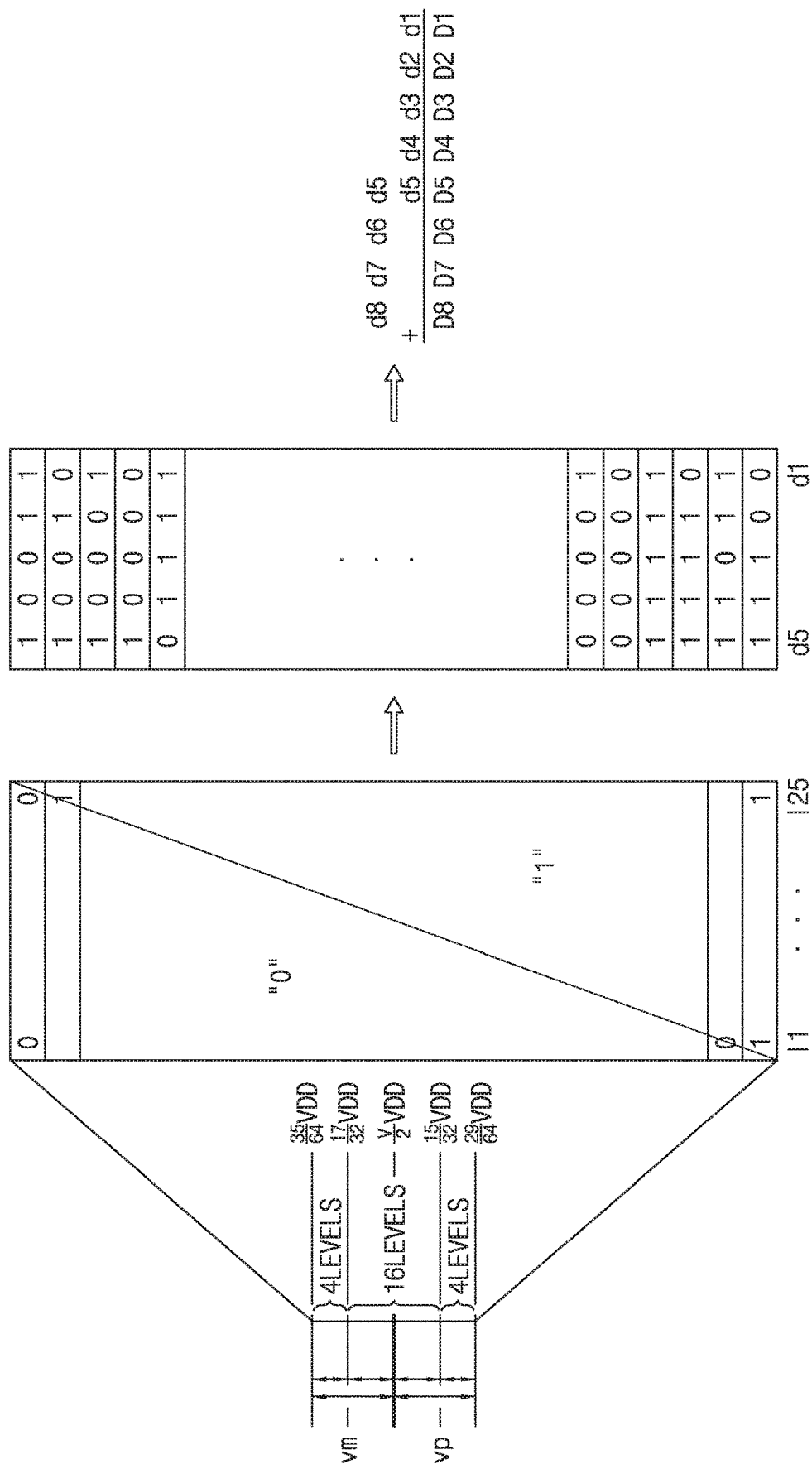
FIG. 6 is a conceptual diagram for describing a second analog-digital conversion operation and an error correction operation according to an example embodiment of the inventive concept.

FIG. 6 is a conceptual diagram for describing the second analog-digital conversion operation and the error correction operation according to an example embodiment of the inventive concept.

Referring to FIGS. 5 and 6, the remaining differential level pair vp, vm of the differential sampling signal pair VP, VM after performing the first analog-digital conversion operation may be present between (15/32)VDD and (17/32)VDD. A level between (15/32)VDD and (17/32)VDD may be divided into 16 levels, and the 16 levels may be represented by different 5-bit lower digital data d5~d1.

The thermometer code generator 30-2 may generate a thermometer code corresponding to a corresponding level among 16 different 25-bit thermometer code I1~I25 when the sampling signal VP or VM is present in one among 16 levels between (15/32)VDD and (17/32)VDD during the second analog-digital conversion operation. The encoder 30-4 may convert the 16 25-bit thermometer code I1~I25 into 16 erroneous 5-bit lower digital data d5~d1 during the second analog-digital conversion operation. For example, the 16 erroneous 5-bit lower digital data d5~d1 may be data from "00000" to "01111".

Further, when the remaining differential level pair vp, vm of the differential sampling signal pair VP, VM is present between (15/32)VDD and (29/64)VDD and between (17/32)VDD and (35/64)VDD, the remaining differential level pair vp, vm may be considered as an error and be corrected. A level between (17/32)VDD and (35/64)VDD may be divided into 4 levels, and the 4 levels may be represented by different 5-bit error digital data.

During the second analog-digital conversion operation, the thermometer code generator 30-2 may generate a thermometer code corresponding to a corresponding level among four different 25-bit thermometer code I1~I25 when the signal VP or VM is present in one among the four levels between (15/32)VDD and (29/64)VDD. The encoder 30-4 may convert the four 25-bit thermometer code I1~I25 into four 5-bit first error digital data d5~d1 during the second analog-digital conversion operation. For example, the four 5-bit first error digital data d5~d1 may be data from "11100" to "11111". Further, the thermometer code generator 30-2 may generate a thermometer code corresponding to a corresponding level among four different 25-bit thermometer code I1~I25 when the signal VP or VM is present in one among four levels between (17/32)VDD and (35/64)VDD during the second analog-digital conversion operation. The encode 30-4 may convert the four 25-bit thermometer code I1~I25 into the four 5-bit second error digital data d5~d1 during the second analog-digital conversion operation. For example, the four 5-bit second error digital data d5~d1 may be from "10000" to "10011".

During the error correction operation, a final digital data D8D7D6D5D4D3D2D1 may be generated by adding the 4-bit upper digital data d8d7d6d5 and the 5-bit lower digital data or the first error digital data d5d4d3d2d1, or by adding the 4-bit upper digital data d8d7d6d5 and data 1d5d4d3d2d1 obtained by adding "1" to an upper bit of the second error digital data d5d4d3d2d1. During the error correction operation, when an upper bit (for example, D9) of "1" is generated, the upper data (for example, D9) may be truncated.

Figure 7A:
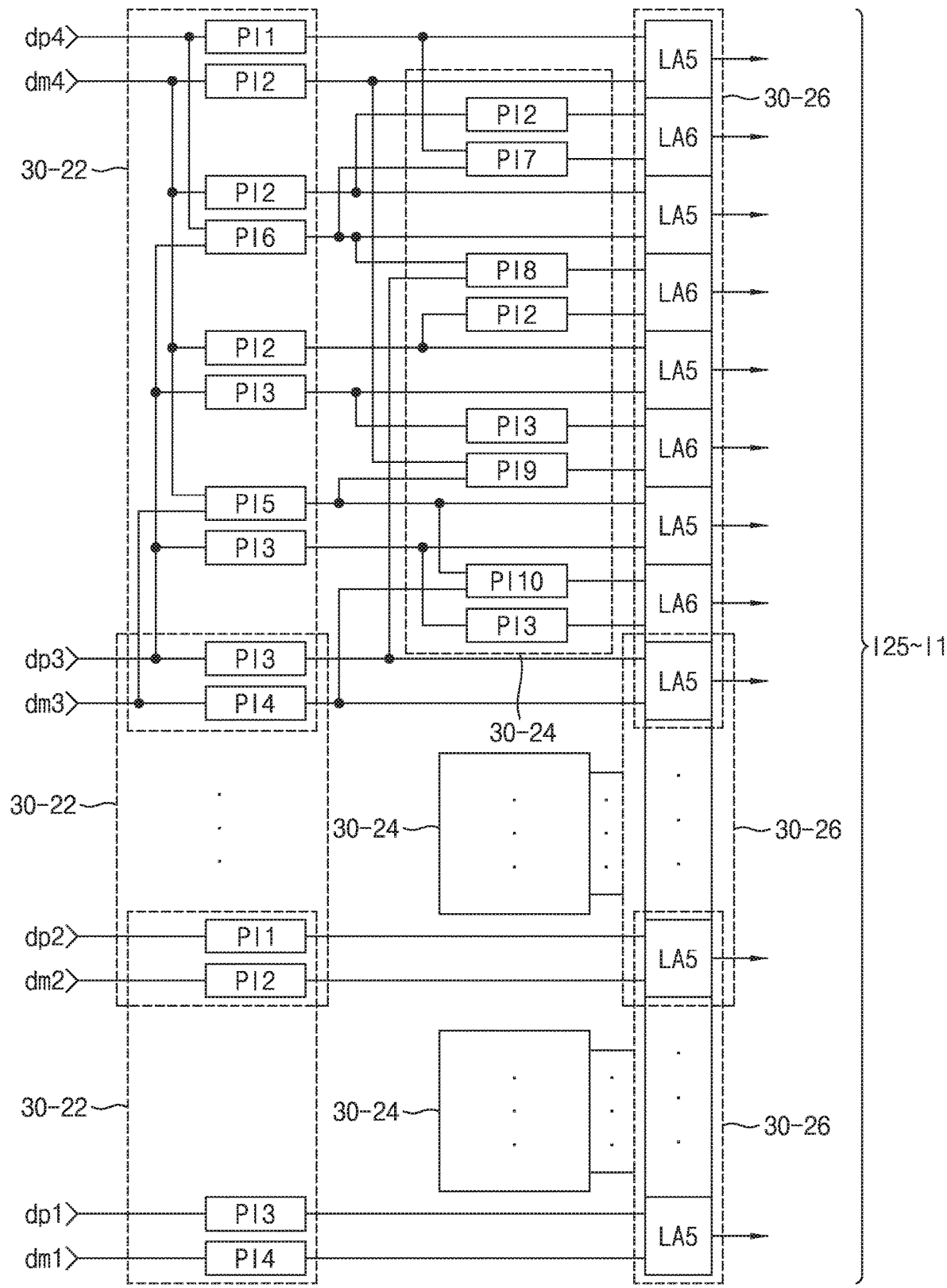
FIG. 7A is a diagram illustrating a configuration of a thermometer code generator according to an example embodiment of the inventive concept.

FIG. 7A is a diagram illustrating a configuration of the thermometer code generator according to an example embodiment of the inventive concept.

The thermometer code generator shown in FIG. 7A illustrates a configuration of the thermometer code generator 30-2 shown in FIG. 1. The thermometer code generator 30-2 may include three first interpolation units 30-22, three second interpolation units 30-24, and three latch units 30-26.

Referring to FIG. 7A, one of the three first interpolation units 30-22 may include first to fourth phase interpolators PI1 to PI4 of performing a phase interpolation operation on corresponding data of two second differential data pairs (dp4, dm4), (dp3, dm3), and (for example, when assuming that dp4 to dp1 have positive polarities and dm4 to dm1 have negative polarities) fifth and sixth phase interpolators PI5 and PI6 of performing the phase interpolation operation on corresponding two data of two data dm4, dm3 and two data dp4, dp3 having the same polarity. One of the three second interpolation units 30-24 may include seventh to tenth phase interpolators PI7 to PI10 of performing the interpolation operations on corresponding two data of output data of the first phase interpolator PI1 and output data of the fifth phase interpolator PI5, output data of the fifth phase interpolator PI5 and output data of the third phase interpolator PI3, output data of the second phase interpolator PI2 and output data of the sixth phase interpolator PI6, and output data of the sixth phase interpolator PI6 and output data of the fourth phase interpolator PI4, One of the three latch units 30-26 may include 9 latches LA5 and LA6 that are alternately arranged and latch to output corresponding two data of the output data of the first phase interpolator PI1 and the output data of the second phase interpolator PI2, the output data of the second phase interpolator PI2 and the output data of the seventh phase interpolator PI7, the output data of the second phase interpolator PI2 and the output data of the fifth phase interpolator PI5, the output data of the second phase interpolator PI2 and the output data of the eighth phase interpolator PI8, the output data of the second phase interpolator PI2 and the output data of the third phase interpolator PI3, the output data of the ninth phase interpolator PI9 and the output data of the third phase interpolator PI3, the output data of the sixth phase interpolator PI6 and the output data of the third phase interpolator PI3, the output data of the tenth phase interpolator PI10 and the output data of the third phase interpolator PI3, and the output data of the third phase interpolator PI3 and the output data of the fourth phase interpolator PI4.

Each of remaining two first interpolation units 30-22 may have the same configuration as the first interpolation unit 30-22 described above, each of the remaining two interpolation units 30-24 may have the same configuration as the second interpolation unit 30-24 described above, and each of remaining two latch units 30-26 may have the same configuration as the latch unit 30-26 described above.

Figure 7B:
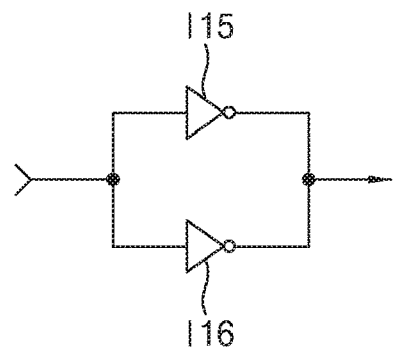
FIG. 7B is a diagram illustrating a configuration of a phase interpolator according to an example embodiment of the inventive concept.
Figure 7B:
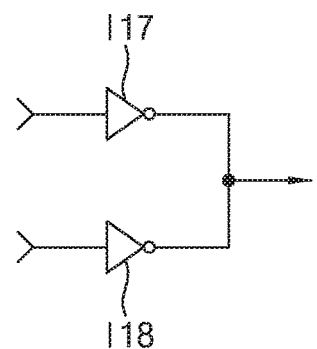

FIG. 7B is a diagram illustrating a configuration of the phase interpolator according to an example embodiment of the inventive concept.

Referring to FIGS. 7A and 7B, each of the first to fourth phase interpolators PI1 to PI4 may include fifteenth and sixteenth inverters I15 and I16 that are connected in parallel, and each of the fifth to tenth phase interpolators PI5 to PI10 may include the seventh and eighteenth inverters I17 and I18 that are connected in parallel.

Referring to FIG. 7B, each of the first to fourth phase interpolators PI1 to PI4 may invert a phase of the same signal by the fifteenth and sixteenth inverters I15 and I16, and generate an output signal by interpolating phases of the inverted signals. Each of the fifth to tenth phase interpolators PI5 to PI10 may invert each of phases of different signals by the seventeenth and eighteenth inverters I17 and I18, and generate an output signal by interpolating phases of the inverted signals.

Figure 8A:
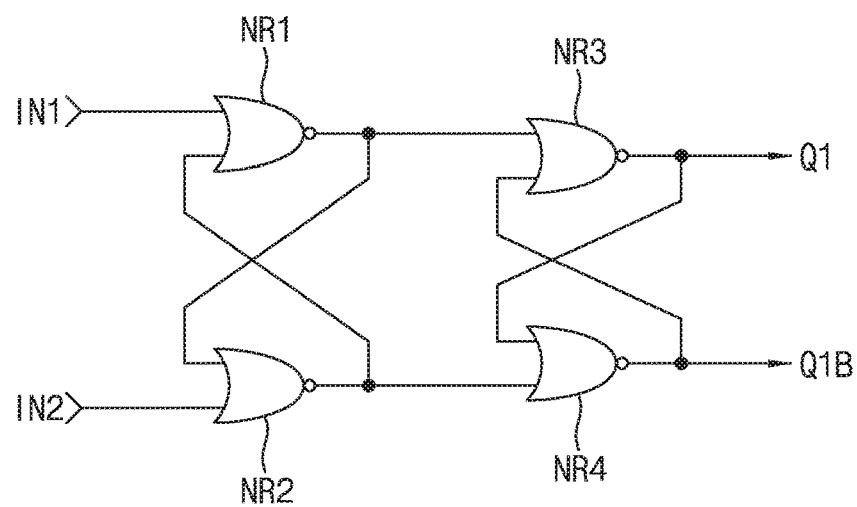
FIGS. 8A and 8B are diagrams illustrating configurations of a fifth latch and a sixth latch according to an example embodiment of the inventive concept.
Figure 8B:
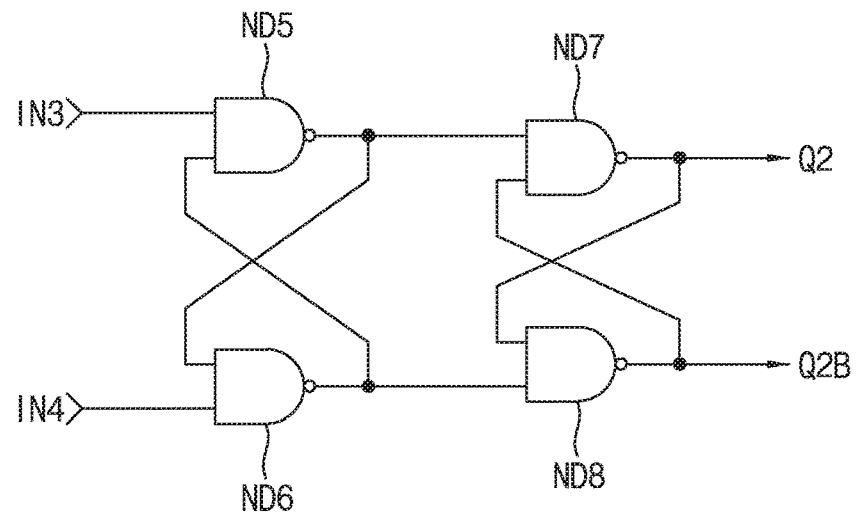

FIGS. 8A and 8B are diagrams illustrating configurations of the fifth latch and the sixth latch according to an example embodiment of the inventive concept.

Referring to FIGS. 7A, 8A and 8B, the fifth latch LA5 may include four NOR gates NR1 to NR4, and the sixth latch LA6 may include four NAND gates ND5 to ND8.

The fifth latch LA5 may be a NOR-type S-R latch, and the sixth latch LA6 may be a NAND-type S-R latch. In FIG. 7A, the reason why the fourth latch LA5 and the sixth latch LA6 are alternately used may be because the second differential data pairs applied to the fifth latches LA5 are generated through one inverter of the first interpolation unit 30-22 and the second differential data pairs applied to the sixth latches LA6 are generated through two inverters that are connected in series of the first interpolation unit 30-22.

The thermometer code generator 30-2 shown in FIG. 7A is described in detail in a paper disclosed as a title "A 65-nm CMOS 6-bit 2.5-GS/s 7.5-mW 8× Time-Domain Interpolating Flash ADC With Sequential Slope-Matching Offset Calibration" in IEEE Journal. Solid-State Circuits, vol. 54, no. 1, pp. 288-297 dated on January, 2019, by two of co-inventors of the inventive concept. As an example, the time-domain interpolators TDI disclosed in FIG. 4(a) of the paper correspond to the phase interpolators PI shown in FIG. 7B, the voltage-time converters VTC disclosed in FIG. 4(b) of the paper have a configuration and perform an operation that are different from the voltage-time converters 20-22 and 20-24 shown in FIG. 3, but two adjacent differential data pairs (($DL_{1\_8}^+$, $DL_{1\_8}^-$), ($DL_{1\_0}^+$, $DL_{1\_0}^-$)) generated from the voltage-time converters VTC disclosed in FIG. 4(b) of the paper correspond to two adjacent differential data pairs (DP4, DM4), (DP3, DM3) generated from the voltage-time converters 20-22 and 20-24 shown in FIG. 3. The fifth latch LA5 shown in FIG. 8A corresponds to the NOR-type S-R latch shown in FIG. 4(d) of the paper, and the sixth latch LA6 shown in FIG. 8B corresponds to the NAND-type S-R latch shown in FIG. 4(d) of the paper. Accordingly, detailed descriptions regarding the configurations shown in FIGS. 7A, 7B, 8A and 8B will be understood with reference to the paper.

Figure 9:
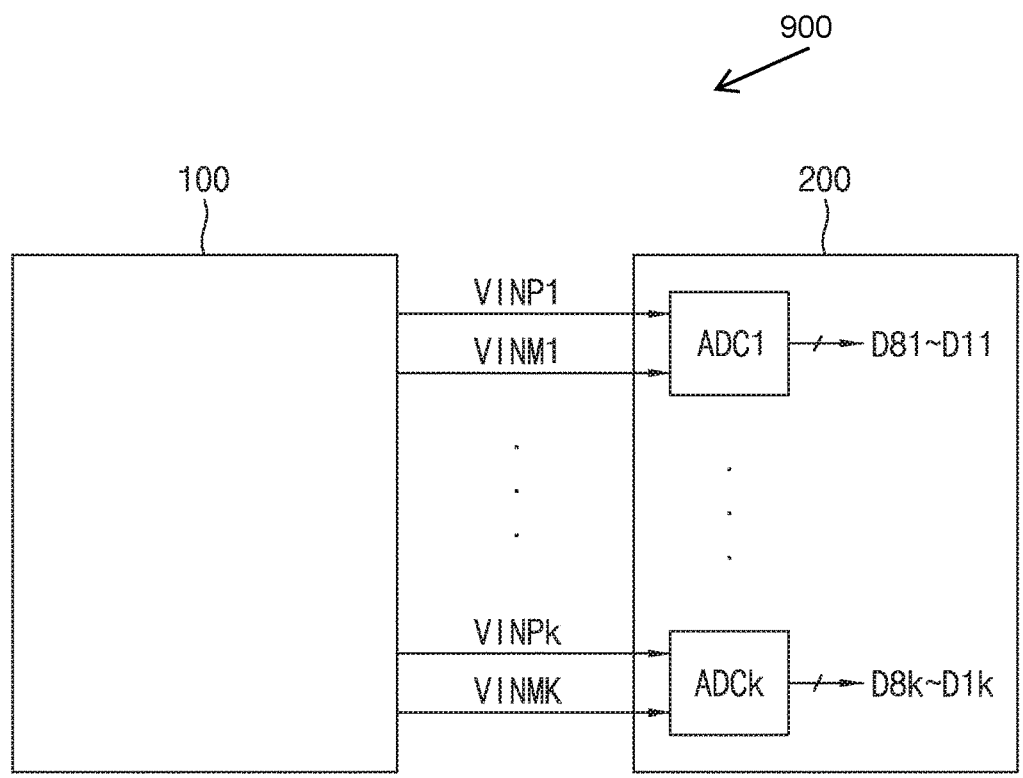
FIG. 9 is a block diagram illustrating a configuration of a system according to an example embodiment of the inventive concept.

FIG. 9 is a block diagram illustrating a configuration of a system according to an example embodiment of the inventive concept. A system 900 may include a transmission unit 100 and a reception unit 200, and the reception unit 200 may include k analog-digital converters ADC1 to ADCk.

Referring to FIG. 9, the transmission unit 100 may transmit k differential input signal pairs (VINP1, VINM1) to (VINPk, VINMk). The k analog-digital converters ADC1 to ADCk may receive the k differential input signal pairs (VINP1, VINM1) to (VINPk, VINMk) to generate k 8-bit digital data (D81~D11) to (D8k~D1k).

Each of the k analog-digital converters ADC1 to ADCk may have the same configuration and perform the same operation as the analog-digital converter described above with reference to FIGS. 1 to 8B.

For example, the transmission unit 100 may be a control unit 100, and the reception unit 200 may be a semiconductor memory device. When the reception unit 200 is the semiconductor memory device, the semiconductor memory device may receive levels of the differential input signal pair applied through one pin and internally generate 8-bit digital data to store a memory cell array.

The analog-digital converter described above with reference to FIGS. 1 to 8B as well as the system 900 shown in FIG. 9 may be applied to various units (devices, apparatuses) in which the analog signal is converted into the digital data.

According to the analog-digital converter and the semiconductor device having the same according to example embodiments of the inventive concept, each bit of n-bit upper digital data may be sequentially generated using the first analog-digital conversion unit, the n-bit lower digital data may be simultaneously generated using the second analog-digital conversion unit, and thus the analog-digital conversion operation may be performed at high speed.

According to the analog-digital converter and the semiconductor device having the same according to example embodiments of the inventive concept, the second analog-digital conversion unit may generate the n-bit lower digital data using the n differential data pairs generated from the four voltage-time converters of the first analog-digital conversion unit, and thus a configuration may be simplified.

Further, according to the analog-digital converter and the semiconductor device having the same according to example embodiments of the inventive concept, the n-bit upper digital data may be generated by performing the charging operation of the four voltage-time converters, and the n-bit lower digital data may be generated by performing the discharging operation of the four voltage-time converters, and thus power consumed for the reset operation may be reduced.

While the disclosure has been shown and described with reference to example embodiments thereof, it will be apparent to those skilled in the art that various changes in form and detail may be made without departing from the spirit and characteristics of the disclosure. The above embodiments are therefore to be construed in all aspects as illustrative and not restrictive.

What is claimed is:

1. An analog-digital converter comprising:
   a first analog-digital conversion unit configured to:
   during a first analog-digital conversion operation:
   sequentially charge each of n first differential node pairs, in response to a respective one of a differential sampling signal pair and first to $(n-1)^{th}$ differential signal pairs among n differential signal pairs;
   in response to each of the n first differential node pairs being sequentially charged, sequentially generate each of n first differential data pairs; and
   sequentially generate each of n upper differential data pairs to be used as n-bit upper digital data, in response to a respective one of the sequentially-generated n first differential data pairs;
   during a second analog-digital conversion operation:
   simultaneously discharge each of the n first differential node pairs, in response to a $n^{th}$ differential signal pair among the n differential signal pairs; and
   in response to each of the n first differential node pairs being simultaneously discharged, generate n second differential data pairs having different phases or the same phase; and
   a second analog-digital conversion unit configured to:
   perform a plurality of phase interpolation operations on at least two adjacent data of the n second differential data pairs to generate a $(2^n+m)$-bit thermometer code, m being smaller than $2^n$; and
   encode the $(2^n+m)$-bit thermometer code to generate at least (n+1)-bit lower digital data.

2. The analog-digital converter according to claim 1, further comprising a sampling and charging and discharging unit configured to:
   during a sampling operation:
   sample a differential input signal pair to generate the differential sampling signal pair; and generate the differential sampling signal pair to a
second differential node pair; and
during the first analog-digital conversion operation:
charge and discharge the second differential node pair,
in response to each of the n upper differential data
pairs that are sequentially generated; and
sequentially generate each of the n differential signal
pairs changing from the differential sampling signal
pair.

3. The analog-digital converter according to claim 2, wherein the sampling and charging and discharging unit comprises:
a first charger and discharger connected to a first node of the second differential node pair, and configured to charge and discharge the first node by a level corresponding to a binary weight of each of the n upper differential data pairs; and
a second charger and discharger connected to a second node of the second differential node pair, and configured to discharge and charge the second node by the level corresponding to the binary weight of each of the n upper differential data pairs.

4. The analog-digital converter according to claim 1, wherein the first analog-digital conversion unit comprises:
n voltage-time converters configured to:
reset the n first differential node pairs to a ground voltage, in response to a pull-down reset clock signal before a sampling operation;
during the first analog-digital conversion operation, sequentially charge each of the n first differential node pairs, in response to a respective one of n pull-up clock signals that are sequentially generated and the respective one of the differential sampling signal pair and the first to the $(n-1)^{th}$ differential signal pairs which are sequentially generated, to sequentially generate each of the n first differential data pairs;
reset the n first differential node pairs to a power supply voltage, in response to a pull-up reset clock signal after the first analog-digital conversion operation; and
during the second analog-digital conversion operation, simultaneously discharge each of the n first differential node pairs, in response to a pull-down clock signal and the $n^{th}$ differential signal pair, to generate the n second differential data pairs; and
n latches configured to sequentially latch each of the n first differential data pairs, to generate the n upper differential data pairs.

5. The analog-digital converter according to claim 4, wherein each of the n voltage-time converters comprises:
a first pull-up reset transistor and a second pull-up reset transistor connected between the power supply voltage and a respective pair of the n first differential node pairs, and configured to reset the respective pair of the n first differential node pairs to the power supply voltage, in response to the pull-up reset clock signal;
a first pull-up transistor and a second pull-up transistor connected in series between the power supply voltage and a first one of the respective pair of the n first differential node pairs, and configured to charge the first one of the respective pair of the n first differential node pairs, in response to a first one of a respective pair of the n differential signal pairs and a first one of the n pull-up clock signals;
a third pull-up transistor and a fourth pull-up transistor connected in series between the power supply voltage and a second one of the respective pair of the n first differential node pairs, and configured to charge the second one of the respective pair of the n first differential node pairs, in response to a second one of a respective pair of the n differential signal pairs and a second one of the n pull-up clock signals;
a first pull-down reset transistor and a second pull-down reset transistor connected between a respective pair of the n first differential node pairs and the ground voltage, and configured to reset the respective pair of the n first differential node pairs to the ground voltage, in response to the pull-down reset clock signal;
a first pull-down transistor and a second pull-down transistor connected in series between the first one of the respective pair of the n first differential node pairs and the ground voltage, and configured to discharge the first one of the respective pair of the n first differential node pairs, in response to the pull-down clock signal and the second one of the respective pair of the n differential signal pairs; and
a third pull-down transistor and a fourth pull-down transistor connected in series between the second one of the respective pair of the n first differential node pairs and the ground voltage, and configured to discharge the second one of the respective pair of the n first differential node pairs, in response to the pull-down clock signal and the first one of the respective pair of the n differential signal pairs.

6. The analog-digital converter according to claim 5, wherein a ratio of a size of the second pull-down transistor to a size of the fourth pull-down transistor of each of the n voltage-time converters is different from each other.

7. The analog-digital converter according to claim 5, wherein a ratio of a size of the second pull-down transistor to a size of the fourth pull-down transistor of a first one of the n voltage-time converters is i:j,
wherein a ratio of a size of the second pull-down transistor to a size of the fourth pull-down transistor of a second one of the n voltage-time converters is x:y,
wherein a ratio of a size of the second pull-down transistor to a size of the fourth pull-down transistor of a third one of the n voltage-time converters is y:x,
wherein a ratio of a size of the second pull-down transistor to a size of the fourth pull-down transistor of a fourth one of the n voltage-time converters is j:i,
wherein a difference between i and j is greater than a difference between x and y, and
wherein i+j is equal to x+y.

8. The analog-digital converter according to claim 4, wherein each of the n latches is a first NAND-type S-R latch.

9. The analog-digital converter according to claim 4, further comprising a timing generation unit configured to:
generate the pull-down reset clock signal before the sampling operation;
during the first analog-digital conversion operation:
generate a first pull-up clock signal among the n pull-up clock signals; and
generate second to $n^{th}$ pull-up clock signals among the n pull-up clock signals by detecting a transition of each of the n first differential data pairs;
generate the pull-up reset clock signal, in response to the $n^{th}$ pull-up clock signal, after the first analog-digital conversion operation; and
generate the pull-down clock signal during the second analog-digital conversion operation.

10. The analog-digital converter according to claim 1, wherein the second analog-digital conversion unit comprises:
- a first phase interpolation unit configured to:
  - perform a phase interpolation operation on corresponding data of two adjacent pairs among the n second differential data pairs, to generate first to fourth interpolation data; and
  - perform the phase interpolation operation on corresponding two data having the same polarity among the two adjacent pairs among the n second differential data pairs, to generate fifth interpolation data and sixth interpolation data;
- a second phase interpolation unit configured to:
  - perform the phase interpolation operation on the first interpolation data and the fifth interpolation data, to generate seventh interpolation data;
  - perform the phase interpolation operation on the fifth interpolation data and the third interpolation data, to generate eighth interpolation data;
  - perform the phase interpolation operation on the second interpolation data and the sixth interpolation data, to generate ninth interpolation data; and
  - perform the phase interpolation operation on the sixth interpolation data and the fourth interpolation data, to generate tenth interpolation data; and
- a latch unit configured to latch and output corresponding two data of the first interpolation data and the second interpolation data, the second interpolation data and the seventh interpolation data, the second interpolation data and the fifth interpolation data, the second interpolation data and the eighth interpolation data, the second interpolation data and the third interpolation data, the ninth interpolation data and the third interpolation data, the sixth interpolation data and the third interpolation data, the tenth interpolation data and the third interpolation data, and the third interpolation data and the fourth interpolation data.

11. The analog-digital converter according to claim 10, wherein the latch unit comprises a NOR-type S-R latch and a second NAND-type S-R latch.

12. The analog-digital converter according to claim 1, wherein the at least (n+1)-bit lower digital data comprises $2^n$ erroneous data, k first error digital data, and k second error digital data, k being smaller than $2^n$, and
- wherein the analog-digital converter further comprises an error correction unit configured to:
  - add the n-bit upper digital data and one of the $2^n$ erroneous data or one of the k first error digital data, to generate final n-bit digital data; or
  - add the n-bit upper digital data and data that is obtained by adding "1" to an upper bit of one of the k first error data, to generate the final n-bit digital data.

13. An analog-digital converter comprising:
- a sampling and charging and discharging unit configured to:
  - during a sampling operation:
    - sample a differential input signal pair to generate a differential sampling signal pair; and
    - generate the differential sampling signal pair to a first differential node pair; and
  - during a first analog-digital conversion operation:
    - charge and discharge the first differential node pair, in response to each of n upper differential data pairs that are used as n-bit upper digital data and that are sequentially generated; and
    - sequentially generate n differential signal pairs changing from the differential sampling signal pair;
- a first analog-digital conversion unit configured to:
  - during the first analog-digital conversion operation:
    - sequentially charge each of n second differential node pairs, in response to a respective one of the differential sampling signal pair and first to $(n-1)^{th}$ differential signal pairs among the n differential signal pairs;
    - in response to each of the n second differential node pairs being sequentially charged, sequentially generate each of n first differential data pairs; and
    - sequentially generate each of the n upper differential data pairs, in response to a respective one of the sequentially-generated n first differential data pairs;
  - during a second analog-digital conversion operation:
    - simultaneously discharge each of the n second differential node pairs, in response to a $n^{th}$ differential signal pair among the n differential signal pairs; and
    - in response to each of the n second differential node pairs being simultaneously discharged, generate n second differential data pairs having different phases or the same phase; and
- a second analog-digital conversion unit configured to:
  - perform a plurality of phase interpolation operations on at least two adjacent data of the n second differential data pairs to generate a $(2^n+m)$-bit thermometer code, m being smaller than $2^n$; and
  - encode the $(2^n+m)$-bit thermometer code to generate at least (n+1)-bit lower digital data.

14. The analog-digital converter according to claim 13, wherein the at least (n+1)-bit lower digital data comprises $2^n$ erroneous data, k first error digital data, and k second error digital data, k being smaller than $2^n$, and
- wherein the analog-digital converter further comprises an error correction unit configured to:
  - add the n-bit upper digital data and one of the $2^n$ erroneous data or one of the k first error digital data, to generate final n-bit digital data; or
  - add the n-bit upper digital data and data that is obtained by adding "1" to an upper bit of one of the k first error data, to generate the final n-bit digital data.

15. The analog-digital converter according to claim 14, wherein the first analog-digital conversion unit comprises:
- n voltage-time converters configured to:
  - reset the n second differential node pairs to a ground voltage, in response to a pull-down reset clock signal before the sampling operation;
  - during the first analog-digital conversion operation, sequentially charge each of the n second differential node pairs, in response to a respective one of n pull-up clock signals that are sequentially generated and the respective one of the differential sampling signal pair and the first to the $(n-1)^{th}$ differential signal pairs which are sequentially generated, to generate each of the n first differential data pairs;
  - reset the n second differential node pairs to a power supply voltage, in response to a pull-up reset clock signal after the first analog-digital conversion operation; and
  - during the second analog-digital conversion operation, simultaneously discharge each of the n second differential node pairs, in response to a pull-down clock signal and the $n^{th}$ differential signal pair;

n latches configured to sequentially latch each of the n first differential data pairs, to generate the n upper differential data pairs; and a timing generation unit configured to:
generate the pull-down reset clock signal before the sampling operation;
during the first analog-digital conversion operation:
generate a first pull-up clock signal among the n pull-up clock signals; and
generate second to $n^{th}$ pull-up clock signals among the n pull-up clock signals by detecting a transition of each of the n first differential data pairs;
generate the pull-up reset clock signal, in response to the $n^{th}$ pull-up clock signal, after the first analog-digital conversion operation; and
generate the pull-down clock signal during the second analog-digital conversion operation.

16. The analog-digital converter according to claim 15, wherein each of the n voltage-time converters comprises:
a first pull-up reset transistor and a second pull-up reset transistor connected between the power supply voltage and a respective pair of the n second differential node pairs, and configured to reset the respective pair of the n second differential node pairs to the power supply voltage, in response to the pull-up reset clock signal;
a first pull-up transistor and a second pull-up transistor connected in series between the power supply voltage and a first one of the respective pair of the n second differential node pairs, and configured charge the first one of the respective pair of the n second differential node pairs, in response to a first one of a respective pair of the n differential signal pairs and a first one of the n pull-up clock signals;
a third pull-up transistor and a fourth pull-up transistor connected in series between the power supply voltage and a second one of the respective pair of the n second differential node pairs, and configured to be charge the second one of the respective pair of the n second differential node pairs, in response to a second one of a respective pair of the n differential signal pairs and a second one of the n pull-up clock signals;
a first pull-down reset transistor and a second pull-down reset transistor connected between a respective pair of the n second differential node pairs and the ground voltage, and configured to reset a respective pair of the n second differential node pairs to the ground voltage, in response to the pull-down reset clock signal;
a first pull-down transistor and a second pull-down transistor connected in series between the first one of the respective pair of the n second differential node pairs and the ground voltage, and configured to discharge the first one of the respective pair of the n second differential node pairs, in response to the pull-down clock signal and the second one of the respective pair of the n differential signal pairs; and
a third pull-down transistor and a fourth pull-down transistor connected in series between the second one of the respective pair of the n second differential node pairs and the ground voltage, and configured to discharge the second one of the respective pair of the n second differential node pairs, in response to the pull-down clock signal and the first one of the respective pair of the n differential signal pairs.

17. A semiconductor device comprising:
a predetermined number of analog-digital converters configured to receive a predetermined number of differential input signal pairs, respectively, from an external source, to generate 2n-bit digital data, respectively,
wherein each of the analog-digital converters comprises:
a sampling and charging and discharging unit configured to:
during a sampling operation:
sample a differential input signal pair to generate a differential sampling signal pair; and
generate the differential sampling signal pair to a first differential node pair; and
during a first analog-digital conversion operation:
charge and discharge the first differential node pair, in response to each of n upper differential data pairs that are used as n-bit upper digital data and that are sequentially generated; and
sequentially generate n differential signal pairs changing from the differential sampling signal pair;
a first analog-digital conversion unit configured to:
during the first analog-digital conversion operation:
sequentially charge each of n second differential node pairs, in response to a respective one of the differential sampling signal pair and first to $(n-1)^{th}$ differential signal pairs among the n differential signal pairs;
in response to each of the n second differential node pairs being sequentially charged, sequentially generate each of n first differential data pairs; and
sequentially generate each of the n upper differential data pairs, in response to a respective one of the sequentially-generated n first differential data pairs;
during a second analog-digital conversion operation:
simultaneously discharge each of the n second differential node pairs, in response to a $n^{th}$ differential signal pair among the n differential signal pairs; and
in response to each of the n second differential node pairs being simultaneously discharged, generate n second differential data pairs having different phases or the same phase; and
a second analog-digital conversion unit configured to:
perform a plurality of phase interpolation operations on at least two adjacent data of the n second differential data pairs to generate a ($2^n$+m)-bit thermometer code, m being smaller than $2^n$; and
encode the ($2^n$+m)-bit thermometer code to generate at least (n+1)-bit lower digital data,
wherein each of the analog-digital converters is configured to generate the 2n-bit digital data, using the n-bit upper digital data and the at least (n+1)-bit lower digital data.

18. The semiconductor device according to claim 17, wherein the at least (n+1)-bit lower digital data comprises $2^n$ erroneous data, k first error digital data, and k second error digital data, k being smaller than $2^n$, and
wherein the analog-digital converter further comprises an error correction unit configured to:
add the n-bit upper digital data and one of the $2^n$ erroneous data or one of the k first error digital data, to generate final n-bit digital data; or
add the n-bit upper digital data and data that is obtained by adding "1" to an upper bit of one of the k first error data, to generate the final n-bit digital data.

19. The semiconductor device according to claim 17, wherein the first analog-digital conversion unit comprises:

n voltage-time converters configured to:
  reset the n second differential node pairs to a ground voltage, in response to a pull-down reset clock signal before the sampling operation;
  during the first analog-digital conversion operation, sequentially charge each of the n second differential node pairs, in response to a respective one of n pull-up clock signals that are sequentially generated and the respective one of the differential sampling signal pair and the first to the $(n-1)^{th}$ differential signal pairs which are sequentially generated, to sequentially generate each of the n first differential data pairs;
  reset the n second differential node pairs to a power supply voltage, in response to a pull-up reset clock signal after the first analog-digital conversion operation; and
  during the second analog-digital conversion operation, simultaneously discharge each of the n second differential node pairs, in response to a pull-down clock signal and the $n^{th}$ differential signal pair, to generate the n second differential data pairs;
n latches configured to sequentially latch each of the n first differential data pairs, to generate the n upper differential data pairs; and
a timing generation unit configured to:
  generate the pull-down reset clock signal before the sampling operation;
  during the first analog-digital conversion operation:
    generate a first pull-up clock signal among the n pull-up clock signals; and
    generate second to $n^{th}$ pull-up clock signals among the n pull-up clock signals by detecting a transition of each of the n second differential data pairs;
  generate the pull-up reset clock signal, in response to the $n^{th}$ pull-up clock signal, after the first analog-digital conversion operation; and
  generate the pull-down clock signal during the second analog-digital conversion operation.

20. The semiconductor device according to claim 19, wherein each of the n voltage-time converters comprises:
a first pull-up reset transistor and a second pull-up reset transistor connected between the power supply voltage and a respective pair of the n second differential node pairs, and configured to reset the respective pair of the n second differential node pairs to the power supply voltage, in response to the pull-up reset clock signal;
a first pull-up transistor and a second pull-up transistor connected in series between the power supply voltage a first one of the respective pair of the n second differential node pairs, and configured charge the first one of the respective pair of the n second differential node pairs, in response to a first one of a respective pair of the n differential signal pairs and a first one of the n pull-up clock signals;
a third pull-up transistor and a fourth pull-up transistor connected in series between the power supply voltage and a second one of the respective pair of the n second differential node pairs, and configured to be charge the second one of the respective pair of the n second differential node pairs, in response to a second one of a respective pair of then differential signal pairs and a second one of the n pull-up clock signals;
a first pull-down reset transistor and a second pull-down reset transistor connected between a respective pair of the n second differential node pairs and the ground voltage, and configured to reset a respective pair of the n second differential node pairs to the ground voltage, in response to the pull-down reset clock signal;
a first pull-down transistor and a second pull-down transistor connected in series between the first one of the respective pair of the n second differential node pairs and the ground voltage, and configured to discharge the first one of the respective pair of the n second differential node pairs, in response to the pull-down clock signal and the second one of the respective pair of the n differential signal pairs; and
a third pull-down transistor and a fourth pull-down transistor connected in series between the second one of the respective pair of the n second differential node pairs and the ground voltage, and configured to discharge the second one of the respective pair of the n second differential node pairs, in response to the pull-down clock signal and the first one of the respective pair of the n differential signal pairs,
wherein a ratio of a size of the second pull-down transistor to a size of the fourth pull-down transistor of each of the n voltage-time converters is different from each other.

* * * * *